United States Patent [19]

Kakalec

[11] 4,013,900

[45] Mar. 22, 1977

[54] CROSS INHIBIT CIRCUIT TO PREVENT MISFIRES OF ALTERNATELY TRIGGERED SWITCHING DEVICES

[75] Inventor: Robert John Kakalec, Madison, N.J.

[73] Assignee: Bell Telephone Laboratories, Incorporated, Murray Hill, N.J.

[22] Filed: Dec. 31, 1975

[21] Appl. No.: 645,894

[52] U.S. Cl. .................. 307/252 K; 307/252 J; 321/12; 328/99
[51] Int. Cl.² ................. H03K 17/72; H02M 1/08
[58] Field of Search ............ 307/252 J, 252 K, 264, 307/268; 321/2, 12, 45 R; 328/99

[56] References Cited

UNITED STATES PATENTS

| | | | |
|---|---|---|---|
| 3,278,827 | 10/1966 | Corey et al. | 307/252 K |
| 3,573,500 | 4/1971 | Leonard | 307/252 K |
| 3,832,573 | 8/1974 | VerPlanck et al. | 321/12 X |

Primary Examiner—John Zazworsky
Attorney, Agent, or Firm—Alfred G. Steinmetz

[57] ABSTRACT

Alternately triggered SCRs are driven by alternately operating pulse circuits sharing a common timing circuit. A cross inhibit circuit prevents misfires by suppressing spurious trigger signals which may be coupled from one pulse circuit to another.

4 Claims, 2 Drawing Figures

CROSS INHIBIT CIRCUIT TO PREVENT MISFIRES OF ALTERNATELY TRIGGERED SWITCHING DEVICES

BACKGROUND OF THE INVENTION

This invention relates to inverter circuits and, more specifically, to inverter circuits using controlled rectifiers. It is particularly concerned with a trigger circuit to enable connection in the controlled rectifiers while preventing mistriggering from spurious signals.

A silicon controlled rectifier (SCR) is basically a diode which operates only when an appropriate trigger signal is applied to its control electrode or gate electrode. The application of an appropriate trigger signal to the gate of a forward biased SCR enables it to conduct current as a diode. In order to permit conduction in a particular SCR, the trigger signal must have certain defined signal characteristics as to magnitude and duration. These characteristics of magnitude and duration, however, are interrelated in that the signal magnitude can be increased thereby decreasing the required signal duration and vice versa.

The interrelated nature of these trigger signal characteristics can result in misfires. That is, an extraneous spurious signal due to external interference can operate to enable conduction in the SCR even though the spurious signal characteristics differ significantly from the normal trigger signal. This spurious signal may be only of short duration but have an extremely high transient signal magnitude or, conversely, may have a very low signal magnitude and a long duration. Because of the interrelations characteristics of a trigger signal required to fire an SCR, a spurious signal can cause the SCR to fire and cause circuit damage.

The typical inverter circuit usually includes two SCRs which are fired or enabled to conduct in an alternate fashion. In order to achieve symmetry in the signals transmitted by the alternately conducting SCRs, a common timing circuit is generally utilized to supply the timing function to the pulse generation circuit of each SCR. Because the timing circuit is common to both pulse generation circuits, spurious signals can be coupled from one pulse generation circuit to another. If both SCRs of an inverter conduct simultaneously, a switchthrough condition occurs wherein a portion of the inverter circuit is short-circuited resulting in very high currents. These high currents can damage the SCR switching devices and shorten the life of the inverter circuit.

SUMMARY OF THE INVENTION

It is therefore an object of the invention to prevent a switchthrough condition in SCR inverters due to misfires of the SCRs.

It is another object of the invention to positively prevent the application of spurious triggering signals to the gates of SCRs.

Therefore, in accord with the principles of the present invention, an inverter circuit is disclosed having two alternately enabled SCR devices. A pulsing circuit is utilized to generate two pulse trains wherein the pulses occur alternately and are coupled to pulse transformers to alternately enable the two SCRs conducting. A cross inhibit circuit is included in the triggering circuit and includes a winding on each pulse transformer. The two windings are coupled by a high impedance and the connecting conducting path is oriented so that a pulse signal enabling conduction in one of the SCRs induces a signal in the other winding to disable conduction in the other SCR. The high impedance coupling the two windings has a magnitude sufficient to attenuate signals due to stored energy in the transformer to a level insufficient to permit triggering of the SCRs to enable conduction therein. The cross inhibit circuit acts as a selective coupling by selectively applying negative trigger signals and blocking signal transmission as is appropriate to prevent misfires.

DETAILED DESCRIPTION

Figure 1:
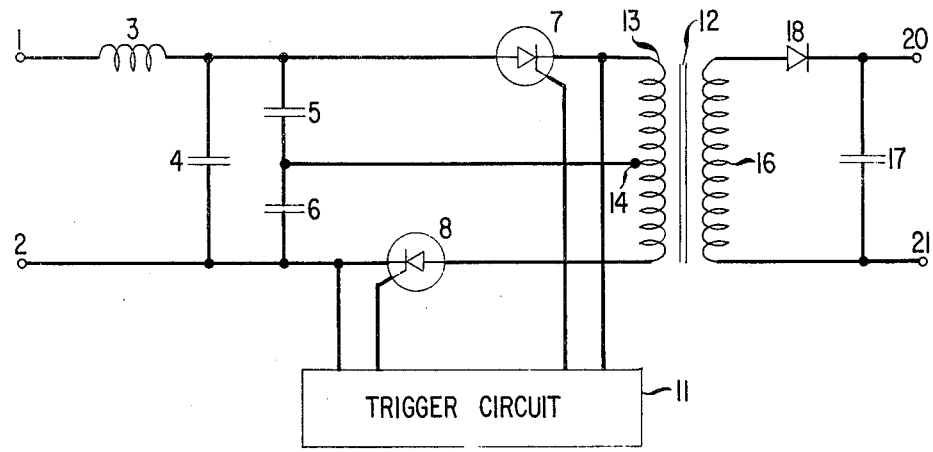
FIG. 1 discloses a series inverter whose SCRs are triggered by a triggering circuit embodying the principles of the invention.

The series inverter circuit disclosed in FIG. 1 has a DC voltage applied to the two input terminals 1 and 2. This DC voltage is smoothed by an input filter comprising the inductor 3 and filter capacitor 4. The input terminals 1 and 2 are coupled via the filter and the SCRs 7 and 8 to a primary winding 13 of the transformer 12. Both SCRs 7 and 8 are poled in the same conductive direction to form a conventional series inverter configuration. The primary winding 13 includes a center tap 14 which is coupled to a common junction of two series connected capacitors 5 and 6. The series connection is coupled in parallel with the input filter capacitor 4. During each cycle of operation the SCR 7 is first enabled conducting to permit current flow to charge the two capacitors 5 and 6. The SCR 7 is enabled conducting in response to a trigger signal generated by the trigger circuit 11. After the capacitors 5 and 6 are charged, the SCR 7 is reverse biased non-conducting and the trigger circuit 11 subsequently enables the SCR 8 conducting to permit discharge of the two capacitors 5 and 6.

When either of the SCRs 7 and 8 are conducting, the initial polarity across secondary winding 16 reverse biases the output rectifying diode 16. As the SCRs 7 and 8 continue to conduct, the voltage across secondary winding 16 reverses and forward biases the output rectifying diode 16. The energy stored in the transformer 12 is transmitted to the output capacitor 17 and from thence to a load connected to the output terminals 20 and 21. The output voltage at terminals 20 and 21 is a function of the frequency at which the series inverter circuit operates. This frequency is controlled by the trigger circuit 11. A detailed discussion of the operation of this type of series inverter circuit may be found in U.S. Pat. No. 3,784,893 issued to Robert Rando on Jan. 8, 1975 and assigned to the same assignee as this application. It is important herein to note that it is undesirable that the two SCRs 7 and 8 be both biased conducting simultaneously.

Figure 2:
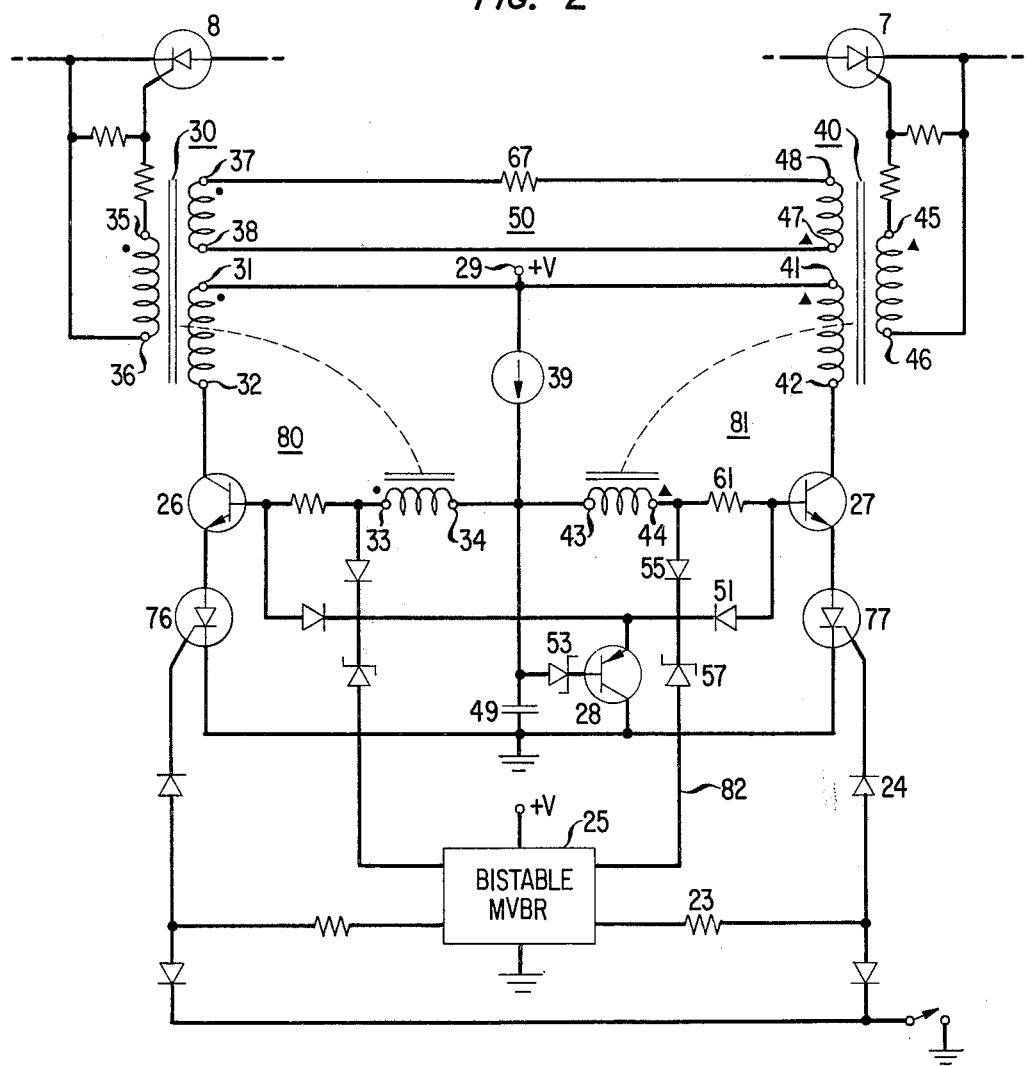
FIG. 2 discloses a triggering circuit to control conduction in the two SCRs of the series inverter disclosed in FIG. 1 and embodying circuitry illustrating the principles of the invention.

In order to achieve symmetry of the alternate conducting periods, the trigger circuit 11, as shown in FIG. 2, has a timing control common to the two pulsing circuits 81 and 80 which drive the two SCRs 7 and 8, respectively. The trigger circuit shown in FIG. 2 has included therein a cross inhibit circuit to permit the use of a common timing circuit to control both SCRs without generating spurious trigger signals which may cause misfires and permit the SCRs 7 and 8 to conduct simultaneously. As shown in FIG. 2, SCR 7 and SCR 8 correspond to SCR 7 and SCR 8 shown in FIG. 1. Selection of the particular SCR 7 or SCR 8 to be triggered conducting is controlled in response to a bistable multivibrator 25 which alternately enables a pulse to be generated and applied to either SCR 7 or SCR 8. The principles of the invention may be best understood by describing the operation of the trigger circuit.

The voltage source V, applied to terminal 29, energizes a current source 39 which charges a timing capacitor 49. The timing capacitor 49 is common to both pulse circuits 81 and 80. For the present, assume that the SCR 7 is being biased conducting. The SCR 77 is enabled to conduct by the output signal of the bistable multivibrator 25 applied to its gate electrode via resistor 23 and diode 24. The current source 39 charges the capacitor 49 and the voltage thereon builds up to a level where it is sufficient to forward bias the base emitter junction of the transistor 27. With the base emitter junction forward biased, transistor 27 begins to conduct through the previously enabled SCR 77 and draws a current through the winding 41-42 of transformer 40. The current in winding 41-42 induces a feedback current in the coupled winding 43-44. This feedback or regenerative current drives the transistor 27 further into its conduction state. The current through transistor 27 rapidly increases due to the regenerative feedback and the transistor 27 becomes saturated.

The voltage generated in winding 43-44 is applied, via diode 55 and the voltage breakdown diode 57, to the trigger input 82 of the bistable multivibrator 25 causing it to switch state. The changed state of the multivibrator 25 now applies an enabling trigger signal to the gate of SCR 76. This prepares the pulse generator 80 for the generation of a trigger signal by conduction of transistor 26 to enable SCR 8 in the following half-cycle of the inverter. During the present half-cycle the SCR 77 continues to conduct since it remains forward biased.

It is apparent from examination of the trigger circuit that the regenerative feedback winding 43-44 is electrically coupled to the regenerative feedback winding 34-33 of the oppositely phased trigger pulse circuit 80. Because of the cross inhibit circuit 50 it is impossible to induce therein a signal which might generate a spurious trigger signal in the winding 35-36. The cross inhibit circuit 50 includes a winding 47-48 coupled to transformer 40. The winding 47-48 is coupled through the high impedance 67 to the winding 37-38 of the transformer 30. The magnitude of the high impedance is selected as described hereinbelow. The current flow through winding 41-42 which induces a trigger signal in winding 45-46 also incudes a voltage in winding 47-48 and therefore causes a voltage in winding 37-38 which applies a negative trigger signal via winding 35-36 to the gate of SCR 8 and prevent any spurious trigger signal from enabling conduction therein.

As the capacitor 49 continues to discharge, the base current applied to transistor 27 begins to decrease. The combined voltage across winding 43-44 and resistor 61 increases as a function of time. As the capacitor 49 is further discharged the increasing combined voltage causes the voltage breakdown diode 53 to break down. This completes a circuit loop including the winding 43-44, resistor 61, diode 51, and the base emitter path of the transistor 28. Transistor 28 is rapidly biased into a saturated conduction state. A current is conducted through diode 51 and transistor 28 to divert base current from the base of transistor 27. Hence, the transistor 27 is rapdily cut off and the current in the winding 41-42 of transformer 40 rapidly falls to zero. This rapid decay of current causes a reverse voltage or EMF in the winding 47-48 of transformer 40 due to stored energy therein which, if the two pulsing circuits were magnetically coupled, would induce an unwanted spurious trigger signal. The two windings 47-48 and 37-38 of transformers 40 and 30, respectively, are coupled by a high impedance 67. The magnitude of the impedance 67 is selected so the inductive current due to the reverse voltage or EMF is significantly attenuated by the impedance 67 to a level at which it is very insignificant and cannot trigger the SCR 8.

It is apparent from the foregoing description that the cross inhibit circuit advantageously prevents the coupling of triggering signals from one pulsing circuit to another and prevents the turn-off of one pulsing circuit from inducing turn-on in the oppositely phased SCR due to an undesirable spurious trigger signal.

At this interval, after transistor 27 is biased nonconducting, the voltage on the timing capacitor 49 is now less than zero and is now being charged up again by the current source 39. Neither transistor 26 nor transistor 27 is now conducting. The timing capacitor 49 again charges up to a point at which transistor 26 begins to conduct and the operation of the pulse circuit 82 occurs in a fashion identical to that of the pulse circuit 81.

The above-described cross inhibit circuit comprises a high impedance connecting two windings coupled magnetically to the transformers of both oppositely phased trigger pulse circuits 81 and 80. This advantageously prevents pulses generated by the reverse EMF of a transformer from firing the oppositely phased SCR and also prevents the coupling of a legitimate trigger signal from one trigger pulse circuit to another and yet permits the use of a common timing circuit to both trigger pulse circuits to permit a desired symmetry in firing the two oppositely phased SCRs.

What is claimed is:
1. In a circuit to supply trigger signals to a first and second switching device,
   first means for triggering said first switching device including a first magnetic apparatus,
   second means for triggering said second switching device including a second magnetic apparatus,
   cross inhibit means for inhibiting triggering of said first and second switching devices by spurious trigger signals comprising a first winding coupled to said first magnetic apparatus,
   a second winding coupled to said second magnetic apparatus,
   a high impedance electrical path connecting said first and second windings so that a positive signal in one of said magnetic apparatus causes a negative signal in another of said magnetic apparatus and said high impedance is sufficient to attenuate signals due to stored energy inside said magnetic apparatus below a trigger threshold level.

2. A circuit as defined in claim 1 wherein said first and second means for triggering share a common timing control circuit and further including means for alternately enabling said first and second means for triggering.

3. An SCR trigger circuit comprising first pulse generating means including a first output transformer, second pulse generating means including a second output transformer, a timing circuit common to said first and second pulse generating means, means for alternately activating said first and second pulse generating means, a cross inhibit circuit including a first winding coupled to said first output transformer, a second winding coupled to said second output transformer, and a conduction path including a high impedance coupling said first and second winding, said first and second windings being oriented so that a positive trigger signal coupled to one of said first and second output transformers causes a current to flow from one winding to another winding to induce a negative trigger signal in another of said first and second output transformers, and said high impedance having sufficient magnitude to attenuate signals due to stored energy in said first and second output transformers to a level insufficient to trigger on SCR.

4. A control circuit to alternately enable conduction in a first and second switching device comprising a source generating a first and second pulse train, pulses of said first and second pulse train being generated alternately in time, a first transformer coupling the first pulse train to a control electrode of the first switching device, a second transformer coupling the second pulse train to a control electrode of the second switching device, a cross inhibit circuit for preventing misfires of the first and second switching devices comprising a first winding coupled to said first transformer, a second winding coupled to said second transformer, and a high impedance conducting path connecting the first and second windings with a current flow orientation so that current induced in one of the first and second windings in response to a signal to enable conduction in one of the first and second switching devices causes a signal in the other of the first and second windings which induces a signal to disable conduction in the other of the first and second switching devices and the magnitude of the high impedance being sufficient to attenuate signals generated by stored energy in the first and second transformers to a signal level less than a threshold at which the first and second switching devices are enabled conducting.

* * * * *